(12) United States Patent
Marukame et al.

(10) Patent No.: US 10,505,108 B2
(45) Date of Patent: Dec. 10, 2019

(54) MEMCAPACITOR, NEURO DEVICE, AND NEURAL NETWORK DEVICE

(71) Applicant: Kabushiki Kaisha Toshiba, Minato-ku (JP)

(72) Inventors: Takao Marukame, Chuo (JP); Jun Deguchi, Kawasaki (JP); Yoshifumi Nishi, Yokohama (JP); Masamichi Suzuki, Koto (JP); Fumihiko Tachibana, Yokohama (JP); Makoto Morimoto, Yokohama (JP); Yuichiro Mitani, Miura (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 516 days.

(21) Appl. No.: 15/444,902

(22) Filed: Feb. 28, 2017

(65) Prior Publication Data

US 2018/0082168 A1    Mar. 22, 2018

(30) Foreign Application Priority Data

Sep. 20, 2016    (JP) ................................. 2016-183373

(51) Int. Cl.
*H01L 45/00*    (2006.01)
(52) U.S. Cl.
CPC ................................. *H01L 45/1233* (2013.01)
(58) Field of Classification Search
None
See application file for complete search history.

(56) References Cited

U.S. PATENT DOCUMENTS

| 6,844,582 | B2 | 1/2005 | Ueda et al. | |
| 7,859,893 | B2 | 12/2010 | Liu et al. | |
| 2011/0051310 | A1 | 3/2011 | Strachan et al. | |
| 2011/0199814 | A1* | 8/2011 | Meade | H01L 27/101 |
| | | | | 365/149 |
| 2011/0199815 | A1 | 8/2011 | Meade et al. | |
| 2011/0305065 | A1* | 12/2011 | Nazarian | G11C 14/0045 |
| | | | | 365/148 |

(Continued)

FOREIGN PATENT DOCUMENTS

| JP | 2004-30624 | 1/2004 |
| JP | 2010-529580 | 8/2010 |

(Continued)

*Primary Examiner* — Shaun M Campbell
(74) *Attorney, Agent, or Firm* — Oblon, McClelland, Maier & Neustadt, L.L.P.

(57) ABSTRACT

A memcapacitor according to an embodiment includes a first electrode, a first dielectric layer provided on the first electrode, a plurality of variable resistance portions provided separately from each other on the first dielectric layer, a second dielectric layer provided on the first dielectric layer and between the variable resistance portions, and a second electrode provided on the variable resistance portions and the second dielectric layer. Each of the variable resistance portions is formed of a material that allows diffusion of metal atoms constituting the second electrode to inside of the variable resistance portion, and the second dielectric layer is formed of a material that prevents diffusion of the metal atoms constituting the second electrode to inside of the second dielectric layer.

10 Claims, 16 Drawing Sheets

(56) References Cited

U.S. PATENT DOCUMENTS

| 2012/0091420 A1* | 4/2012 | Kusai ................. G11C 11/5685 |
| | | 257/4 |
| 2012/0211721 A1* | 8/2012 | Kawai ................. H01L 27/2409 |
| | | 257/4 |
| 2015/0074028 A1 | 3/2015 | Miyashita |
| 2016/0093800 A1* | 3/2016 | Matsunami ......... H01L 45/1233 |
| | | 257/4 |
| 2016/0172113 A1 | 6/2016 | Reig et al. |

FOREIGN PATENT DOCUMENTS

| JP | 2013-520012 A | 5/2013 |
| JP | 2015-53008 A | 3/2015 |
| JP | 2017-49945 A | 3/2017 |

* cited by examiner

MEMCAPACITOR, NEURO DEVICE, AND NEURAL NETWORK DEVICE

CROSS-REFERENCE TO RELATED APPLICATIONS

This application is based upon and claims the benefit of priority from Japanese Patent Application No. 2016-183373, filed on Sep. 20, 2016; the entire contents of which are incorporated herein by reference.

FIELD

Embodiments described herein relate generally to a memcapacitor, a neuro device, and a neural network device.

BACKGROUND

Large Scale Integration (LSI) technology has been developed along with the development of semiconductor device technology and process technology thereof, and highly integrated memories and high-performance logic integrated circuits have been developed. In a generally used logic circuit, an arithmetic operation is performed by using a binary signal, that is, digital presentation, and the arithmetic operation can be performed for simple numerical calculation at a very high speed. However, a considerable length of time is required for arithmetic operations such as pattern recognition and image processing. Therefore, in recent years, a neural network device that is a computer simulating an information processing method in an animal brain is attracting attention as a device that performs information processing, which conventional LSI arithmetic processing does not handle well, but that an animal such as a human being handles well.

DETAILED DESCRIPTION

Figure 1:
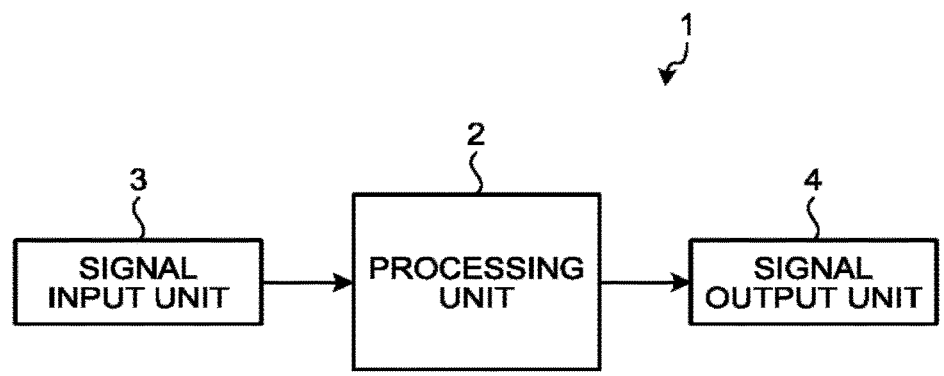
FIG. 1 is a block diagram illustrating a schematic configuration example of a neural network device according to a first embodiment.

Exemplary embodiments of a memcapacitor, a neuro device, and a neural network device will be described in detail below with reference to the accompanying drawings.

In a neural network, information processing is performed with a minimum unit referred to as "neuron" (hereinafter, also "neuro device"). Each neuron has a synapse and realizes a so-called "product-sum operation function" and a so-called "threshold processing function". In the product-sum operation function, the neuron receives a plurality of input signals, integrates the received input signals in the synapse to modulate them, and adds the modulated signals. In the threshold processing function, the neuron performs threshold processing on a result of the product-sum operation.

In a neural network device, a stage that sends out a final output is referred to as "output layer", and a stage between an input and an output (an output layer) is referred to as "intermediate layer". The input and the output are associated with each other by optimally setting a coefficient (a weight) by which the input is multiplied in integration in which a plurality of arithmetic operations are performed in each neuro unit. The arithmetic operation for optimally setting the weight is referred to as "learning".

As described above, it is necessary that the neural network device performs integration for a considerably large number of times, and thus its arithmetic operation time significantly increases with the increase of the number of inputs. Further, in a case where three or more intermediate stages are provided, the number of arithmetic operations further increases, and therefore the arithmetic operation time also further increases. As a method for suppressing the increase of the arithmetic operation time, there is considered a method in which a simple arithmetic operation such as integration, addition, and threshold processing is performed by an analog arithmetic operation.

As a neural network device that performs a simple arithmetic operation by an analog arithmetic operation, it is possible to exemplify a neural network device provided with a neuro device having an integrator as a synapse in which a weight is changed by a weight voltage input thereto. In the following descriptions, this neural network device is referred to as "first example". In the first example, the device functioning as the synapse is constituted by, for example, phase-change or ferroelectric devices of a variable resistance material that are separated into two and arranged between two electrodes, and a dielectric body arranged between the phase-change or ferroelectric devices.

As another neural network device that performs a simple arithmetic operation by an analog arithmetic operation, it is possible to exemplify a neural network device in which an integrator is constituted by a resistance-changing material that changes its crystalline state by application of a weight voltage, in order to realize a phase-change or ferroelectric memory structure having a plurality of resistance states. This neural network device is referred to as "second example". In the second example, the integrator includes a ferroelectric capacitor in which a weight voltage is applied to one of electrodes, and a weight is determined in accordance with a potential of the other electrode of the ferroelectric capacitor.

The two neural network devices exemplified above are configured to perform an arithmetic operation by hardware, by using a synapse device of a resistance-changing film and a dielectric film. However, the integrator used in the neural network device according to the first example has a configuration in which a phase-change or ferroelectric memory by a ferroelectric material (FeRAM) is applied, and therefore has the following problems, which are problems similar to those a FeRAM has. That is, the first problem is that an operation is slow because polarization of the dielectric film is changed to change the weight. The second problem is that it is difficult to realize a practicable number of times of rewriting of the dielectric film because the arithmetic operation is performed a numerous number of times in order to finely change the weight during learning.

The neural network devices according to the first and second examples described above also have a problem that it is difficult to set a plurality of weights with good controllability. For example, there is a hysteresis in a relation between polarization and an applied voltage in the phase-change or ferroelectric device of the integrator, and therefore it is difficult to linearly control the polarization with respect to an input. Because of this problem, in a conventional neural network device, the number of gradations of the coefficient (weight) used for integration is limited.

Further, in a learning operation method of the neural network device according to the second example, the range of changing the weight when the weight is finely changed or is changed to an appropriate value is limited. Therefore, there is also a problem of a tendency that the scale of a network required for convergence of the learning becomes larger.

Therefore, in the following embodiments, there is proposed a memcapacitor that also has a function as a synapse device, as an improved integrator in order to realize long-term reliability of a neural network device and to put the neural network device into practical use. Because the arithmetic operation speed of the integrator is insufficient conventionally and the number of the integrators is largest among devices constituting the neural network device, it can be considered that improvement of the performance of the integrator contributes most to improvement of the performance of the neural network device.

Further, in the following embodiments, both application of a plurality of weights and improvement of the operation speed of the integrator are realized simultaneously by applying technology of a non-volatile multi-value memory to the integrator. A ferroelectric memory and a phase-change or ferroelectric memory can store therein data of two or more values, and the both memories have a writing time of 100 nsec or less. Therefore, it can be considered that applying these multi-value memories to the integrator can largely improve the speed of weight modulation, as compared with a conventional integrator.

First Embodiment

First, a memcapacitor, a neuro device, and a neural network device according to a first embodiment are described in detail with reference to the drawings. FIG. 1 is a block diagram illustrating a schematic configuration example of the neural network device according to the first embodiment. As illustrated in FIG. 1, the neural network device 1 includes a processing unit 2, a signal input unit 3, and a signal output unit 4. The signal input unit 3 inputs an electric signal, which is generated in image processing or the like and is a processing target, to the processing unit 2. The signal output unit 4 outputs the electric signal processed by the processing unit 2.

Figure 2:
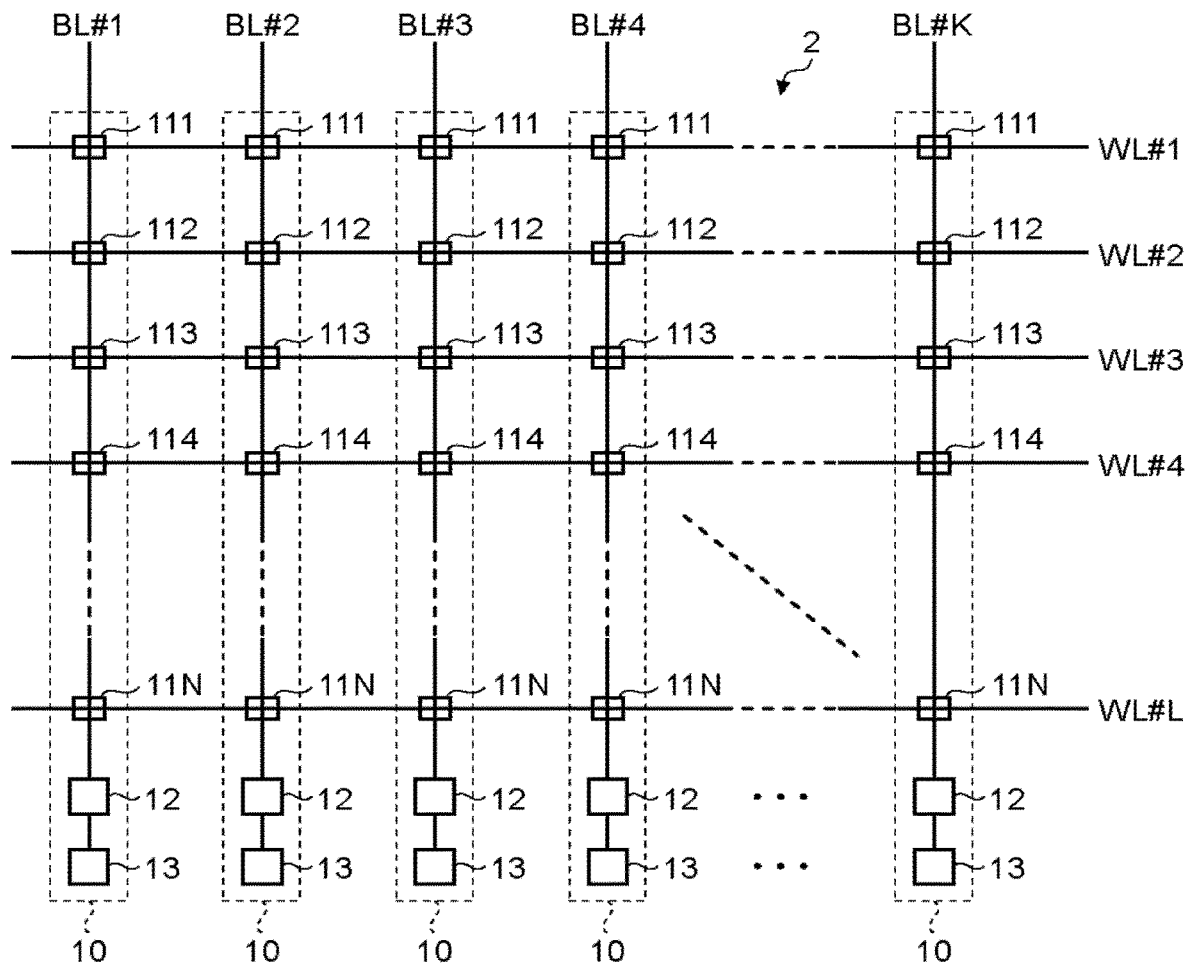
FIG. 2 is a schematic diagram illustrating an example of a processing unit according to the first embodiment.

The processing unit 2 performs arithmetic processing on an input electric signal. FIG. 2 illustrates an example of the processing unit according to the first embodiment. As illustrated in FIG. 2, the processing unit 2 includes a plurality of word lines WL, a plurality of bit lines BL crossing the word lines WL to be vertically separated from the word lines WL, a synapse device 111 that is connected to each of portions where the word lines WL and the bit lines BL come close to each other (hereinafter, the portions are referred to as "cross-points"), and an integrator 12 and a threshold function unit 13 that are connected to respective bit lines BL#1 to BL#K. In this configuration, a plurality of synapse devices 111 to 11N, the integrator 12, and the threshold function unit 13 that are connected to one bit line BL constitute one neuro device 10.

Figure 3:
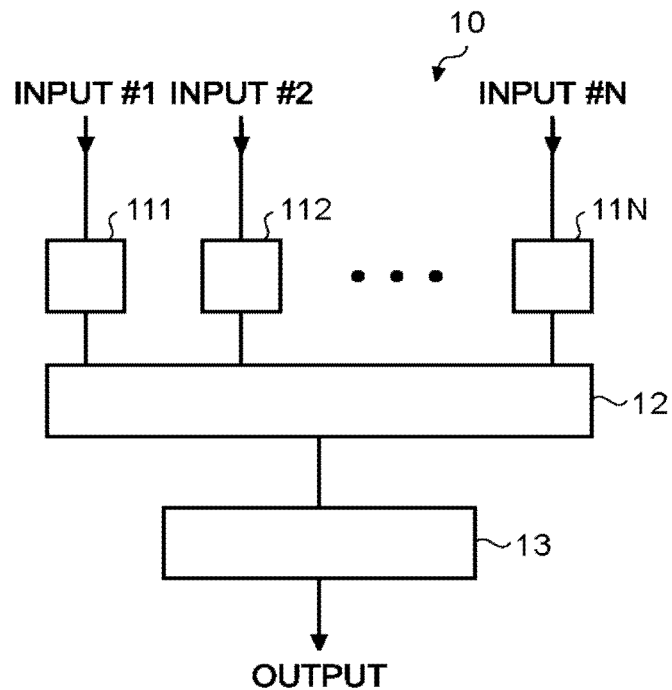
FIG. 3 is a block diagram illustrating a schematic configuration example of a neuro device according to the first embodiment.
Figure 4:
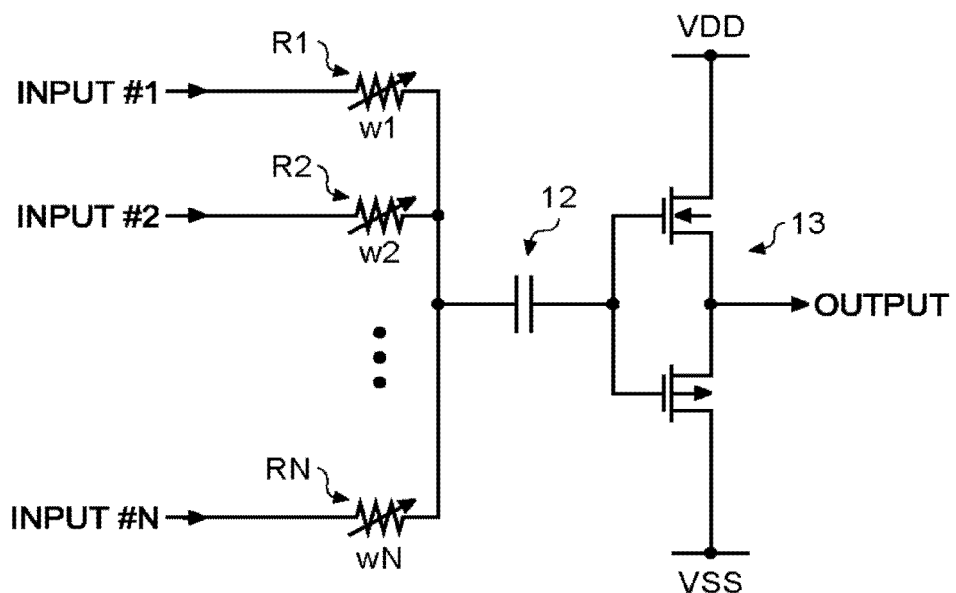
FIG. 4 is a diagram illustrating an example of an equivalent circuit of the neuro device illustrated in FIG. 3.

Each of the neuro devices 10 is a semiconductor device capable of changing its electrostatic capacitance in accordance with an input signal, and performs arithmetic processing on an input signal by changing the electrostatic capacitance. FIG. 3 illustrates a schematic configuration example of the neuro device 10 according to the first embodiment. FIG. 4 illustrates an example of an equivalent circuit of the neuro device 10 illustrated in FIG. 3.

As illustrated in FIG. 3, one neuro device 10 includes a plurality of synapse devices 111 to 11N (N is an integer equal to or larger than 2), the integrator 12, and the threshold function unit 13. Each of the synapse devices 111 to 11N is configured by a memcapacitor 11 capable of changing its electrostatic capacitance to multiple levels in accordance with an input signal. Therefore, as illustrated in FIG. 4, it is possible to regard the respective synapse devices 111 to 11N as variable resistance devices R1 to RN, for example. The variable resistance devices R1 to RN are resistors and are for being provided with the electrostatic capacitance. The integrator 12 is configured by a capacitor, for example. Further, the threshold function unit 13 is configured by an inverter (NOT) circuit including a pMOS (Metal-Oxide Semiconductor) transistor and an nMOS transistor.

Figure 5:
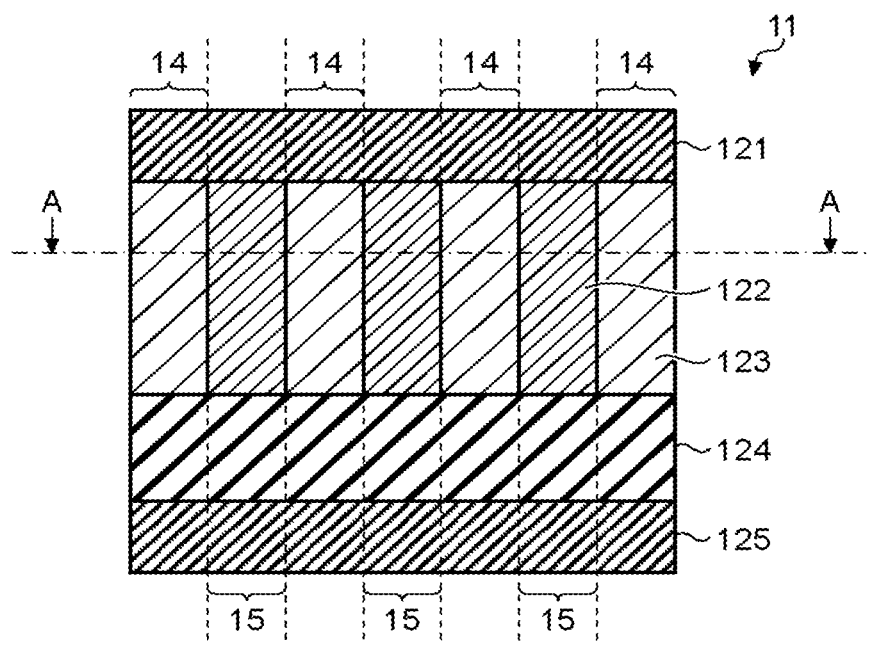
FIG. 5 is a cross-sectional view illustrating a schematic configuration example of a memcapacitor according to the first embodiment.
Figure 6:
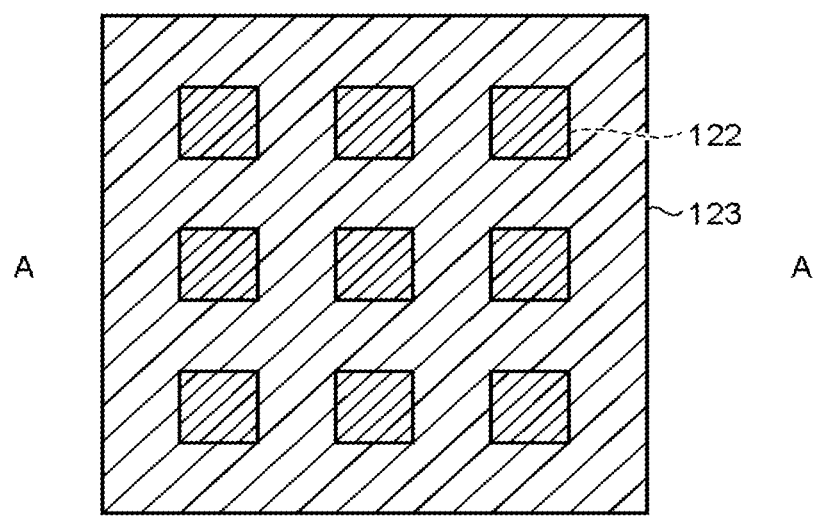
FIG. 6 is a diagram illustrating an A-A cross-section in FIG. 5.

FIG. 5 illustrates a schematic configuration example of the memcapacitor 11 that constitutes each of the synapse devices 111 to 11N. FIG. 6 illustrates an A-A cross-section in FIG. 5. As illustrated in FIG. 5, the memcapacitor 11 includes an upper electrode 121, a lower electrode 125, a first dielectric layer 124, a second dielectric layer 123, and a variable resistance portion 122.

The upper electrode 121 is an electrode arranged on a side to which an electric signal is input, and the lower electrode 125 is arranged on a side from which an electric signal is output. The upper electrode 121 and the lower electrode 125 are arranged with principal surfaces thereof opposed to each other. The upper electrode 121 can be formed of metal or alloy that can be ionized more easily than materials of the lower electrode 125, the first dielectric layer 124, the second dielectric layer 123, and the variable resistance portion 122. Examples of such a material are silver (Ag), nickel (Ni), cobalt (Co), aluminum (Al), titanium (Ti), copper (Cu), or alloy of these elements. Meanwhile, the lower electrode 125 can be formed by using various materials having electrical conductivity, such as metal, alloy, and a semi-conductive material with a dopant added thereto.

The first dielectric layer 124 is a main charge accumulating unit in the memcapacitor 11, and is arranged between the upper electrode 121 and the lower electrode 125 to be close to the lower electrode 125. An oxide film, a nitride film, or an oxinitride film of titanium (Ti), aluminum (Al), silicon (Si), tungsten (W), tantalum (Ta), magnesium (Mg), hafnium (Hf), or the like can be used as the material for the first dielectric layer 124.

A plurality of variable resistance portions 122 and the second dielectric layer 123 are provided between the upper electrode 121 and the first dielectric layer 124. As illustrated in FIGS. 5 and 6, the plurality of variable resistance portions 122 are a layer that changes an electrostatic capacitance of a capacitor formed of the first dielectric layer 124 in appearance based on an input history of an electric signal to each of the synapse devices 111 to 11N, and are arranged to be separated from each other along the principal surface (the surface opposed to the lower electrode 125) of the upper electrode 121. The plurality of variable resistance portions 122 included in one memcapacitor 11 correspond to either one of the variable resistance devices R1 to RN in FIG. 4. Although the variable resistance portions 122 arranged in three columns and three rows are exemplified in FIG. 6, the arrangement is not limited thereto.

Each of the variable resistance portions 122 is formed of a columnar member having two opposed surfaces (referred to as "upper surface" and "lower surface", respectively) that are in contact with the upper electrode 121 and the first dielectric layer 124, respectively. The second dielectric layer 123 is provided in a space between the upper electrode 121 and the first dielectric layer 124, other than the variable resistance portion 122. The variable resistance portion 122 can be formed of silicon (Si), amorphous silicon (α-Si), silicon germanium (SiGe), germanium (Ge), a compound semiconductor, and the like. Meanwhile, the second dielectric layer 123 can be formed of materials such as silicon oxide (SiOx) and silicon nitride (SiN), for example.

Figure 7:
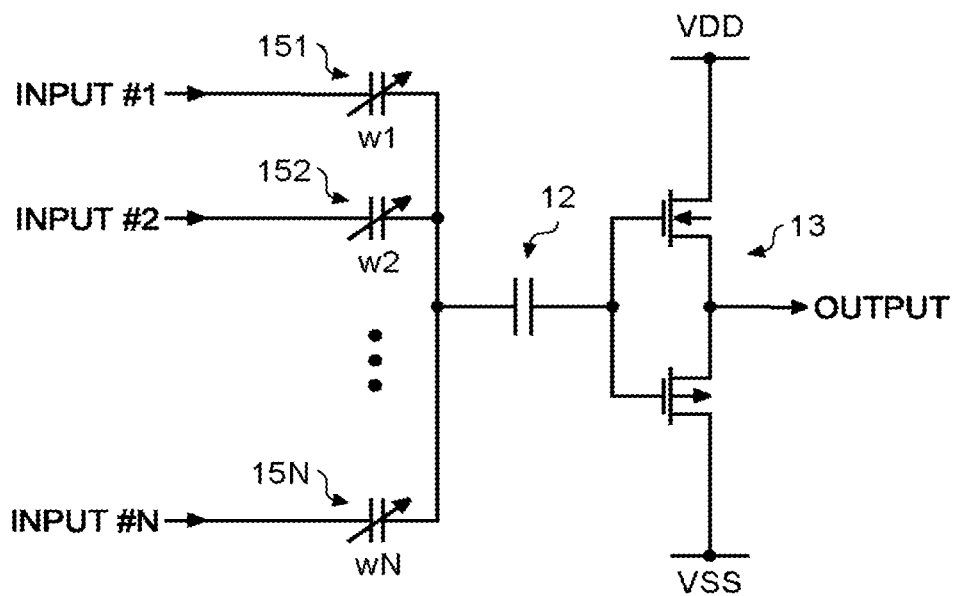
FIG. 7 is a diagram illustrating another example of the equivalent circuit of the neuro device illustrated in FIG. 3.

In the configuration described above, the variable resistance portion 122 allows diffusion of the metal element constituting the upper electrode 121 to the inside of the variable resistance portion 122. Meanwhile, the second dielectric layer 123 prevents diffusion of the metal element constituting the upper electrode 121 to the inside of the second dielectric layer 123. Therefore, as a structure formed of the second dielectric layer 123 and portions of the upper electrode 121, the first dielectric layer 124, and the lower electrode 125, which sandwich the second dielectric layer 123 therebetween, is assumed to be a first capacitor 14 that does not change its electrostatic capacitance with respect to writing, and a structure formed of the variable resistance portion 122 and portions of the upper electrode 121, the first dielectric layer 124, and the lower electrode 125, which sandwich the variable resistance portion 122 therebetween, is assumed to be a second capacitor 15 that changes its electrostatic capacitance in accordance with writing, the equivalent circuit of the neuro device 10 illustrated in FIG. 4 can be replaced with an equivalent circuit including variable capacitors 151 to 15N respectively corresponding to the synapse devices 111 to 11N, the integrator 12, and the threshold function unit 13, as illustrated in FIG. 7.

Figure 8:
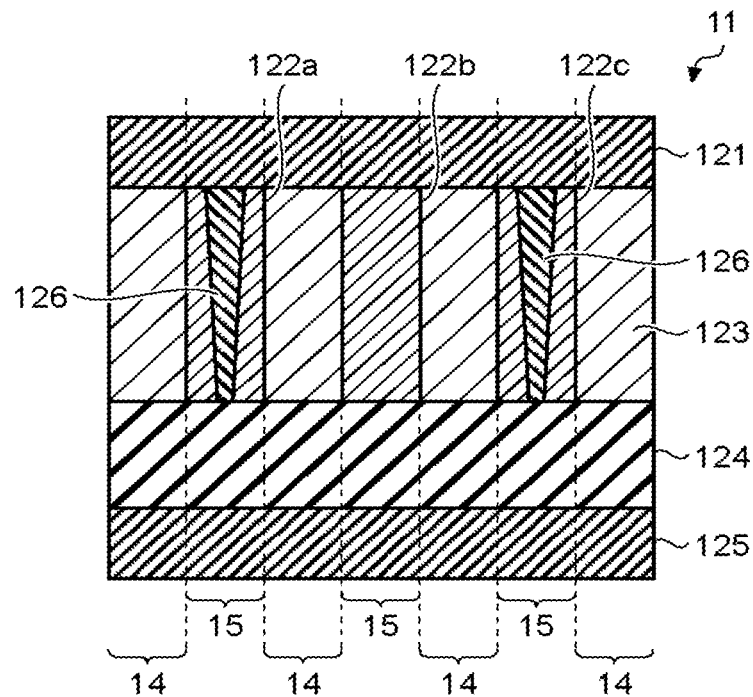
FIG. 8 is a diagram illustrating an example of the memcapacitor illustrated in FIG. 5, after a potential difference of a certain level or higher is applied across an upper electrode and a lower electrode.

FIG. 8 is a diagram illustrating an example of the memcapacitor 11 after a potential difference of a certain level or higher (a writing voltage) is applied across the upper electrode 121 and the lower electrode 125. As illustrated in FIG. 8, when a potential difference of a certain level or higher is applied across the upper electrode 121 and the lower electrode 125, metal atoms in the upper electrode 121 drift into the variable resistance portion 122, so that an electrically conductive filament 126 extending from the upper electrode 121 toward the first dielectric layer 124 is formed inside the variable resistance portion 122. As a result, the electrostatic capacitance of the second capacitor 15 corresponding to this portion increases. On the other hand, the metal atoms in the upper electrode 121 do not drift into the second dielectric layer 123. Therefore, no filament is formed inside the second dielectric layer 123, and the electrostatic capacitance of the first capacitor 14 formed of the second dielectric layer 123 does not change.

Because the first dielectric layer 124 serves as a stopper for the metal atoms constituting the upper electrode 121, the first dielectric layer 124 is formed of a material that prevents diffusion of the metal atoms constituting the upper electrode 121 to the inside thereof. However, when a stopper layer that stops diffusion of the metal atoms is provided between the variable resistance portion 122 and the first dielectric layer 124, various types of dielectric bodies can be used for the first dielectric layer 124.

In the first embodiment, the formation of the filament 126 in the variable resistance portion 122 is a phenomenon that occurs probabilistically, and it is not always the case that the filament 126 is formed in all the variable resistance portions 122. In other words, it is not determined as to which variable resistance portion 122 the filament 126 is formed in by application of a potential difference of a certain level or higher across the upper electrode 121 and the lower electrode 125. In the example illustrated in FIG. 8, for example, the filament 126 is formed in each of variable resistance portions 122a and 122c, whereas no filament is formed in a variable resistance portion 122b.

However, it is possible to statistically control as to approximately how many variable resistance portions 122 the filament 126 is formed in, by controlling the magnitude, application duration, pulse waveform, and the like of the potential difference applied across the upper electrode 121 and the lower electrode 125 (hereinafter, simply "controlling the potential difference"). For example, when the potential difference applied across the upper electrode 121 and the lower electrode 125 is set to be relatively large, the filament 126 is formed in more variable resistance portions 122. On the other hand, when the potential difference applied across the upper electrode 121 and the lower electrode 125 is set to be relatively small, the number of the variable resistance portions 122 in each of which the filament 126 is formed is reduced.

Therefore, in the first embodiment, by controlling the potential difference applied across the upper electrode 121 and the lower electrode 125, the electrostatic capacitance of the memcapacitor 11 (see FIG. 4) is changed at multiple levels. In other words, by controlling the magnitude of the potential difference applied across the upper electrode 121 and the lower electrode 125, each of weights w1 to wN of the variable capacitors 151 to 15N is changed, so that the multi-value memcapacitor 11, that is, the synapse devices 111 to 11N are realized.

Further, the filament 126 formed in the variable resistance portion 122 remains therein as it is in principle, unless a reset operation (hereinafter, also "erase operation") for the memcapacitor 11 is performed thereafter. This means that the history of an electric signal input to each of the synapse devices 111 to 11N is held in the memcapacitor 11. Therefore, an electric signal that is input next is subjected to an arithmetic operation by the memcapacitor 11 that holds the history of the previously input electric signals, and a result of this arithmetic operation is held in the memcapacitor 11 as a new input history. Therefore, a signal extracted by the signal output unit 4 from the neuro device 10 is data of an arithmetic operation result based on the input history.

Next, an operation of the neuro device 10 according to the first embodiment is described with reference to the drawings.

In an initial state, the filament 126 is not formed in the variable resistance portions 122 constituting the synapse devices 111 to 11N of the memcapacitor 11. In this case, the variable resistance portions 122 are in a high-resistance state (see FIG. 5).

In a writing operation, an electric signal is input to the processing unit 2 from the signal input unit 3. In the processing unit 2, when the electric signal is input, a potential difference in accordance with the input electric signal is applied across the upper electrode 121 and the lower electrode 125 in the memcapacitor 11 of a corresponding neuro device 10. For example, a positive potential is applied to the upper electrode 121, and a negative potential or a ground potential is applied to the lower electrode 125. With this application of a potential difference, metal atoms in the upper electrode 121 drift into one or more of the variable resistance portions 122, so that the filament 126 is formed in the one or more variable resistance portions 122 (see FIG. 8). As a result, the variable resistance portion 122 with the filament 126 formed therein is brought into a low-resistance state, and an electrostatic capacitance of the entire memcapacitor 11 changes in accordance with the number of the variable resistance portions 122 that are in a low-resistance state.

Meanwhile, in a reading operation, a potential difference smaller than the potential difference in the writing operation is applied across the upper electrode 121 and the lower electrode 125 in the memcapacitor 11 in a corresponding neuro device 10. This potential difference is a potential difference that does not cause the metal atoms in the upper electrode 121 to drift into the variable resistance portion 122. The signal output unit 4 reads a voltage of an output of the threshold function unit 13 in this state, so that data as an arithmetic operation result is read out from the processing unit 2.

Further, in a reset operation, a potential difference in a direction opposite to the potential difference in the writing operation is applied across the upper electrode 121 and the lower electrode 125 in the memcapacitor 11 in a low-resistance state or all the memcapacitors 11. This application of a potential difference causes the metal atoms present in the variable resistance portion 122 to drift to the upper electrode 121, so that the filament 126 in the variable resistance portion 122 is eliminated.

Next, an arithmetic operation of the neuro device 10 according to the first embodiment is described in detail with reference to the drawings. As described above, in the first embodiment, the synapse devices 111 to 11N that are arithmetic operation gates of a neural network are formed of multi-value memcapacitors 11, respectively. For example, as illustrated in FIG. 7, in a case where two or more variable capacitors 151 to 15N are connected to a gate input of the threshold function unit 13 in parallel, when a voltage V applied to inputs #1 to #N of the respective variable capacitors 151 to 15N are assumed to be an input value X and electrostatic capacitances C of the respective variable capacitors 151 to 15N are assumed to be the weights w1 to wN, a charge value induced in each of the variable capacitors 151 to 15N is a product w×X, based on Coulomb's law (Q=CV). Further, when charges Q induced in all the variable capacitors 151 to 15N are integrated (Q_total=ΣQi (i is an integer from 1 to N)), a gate potential of the threshold function unit 13 caused by the charges Q is a potential obtained by a product-sum operation ΣwX. Due to this operation, an arithmetic operation result in accordance with the electrostatic capacitances (input histories) of the variable capacitors 151 to 15N is output from the threshold function unit 13 that operates as a threshold function. In a case where the input and the output are not inverted, an inverter circuit serving as a buffer can be further added to an output stage of the threshold function unit 13.

Figure 9:
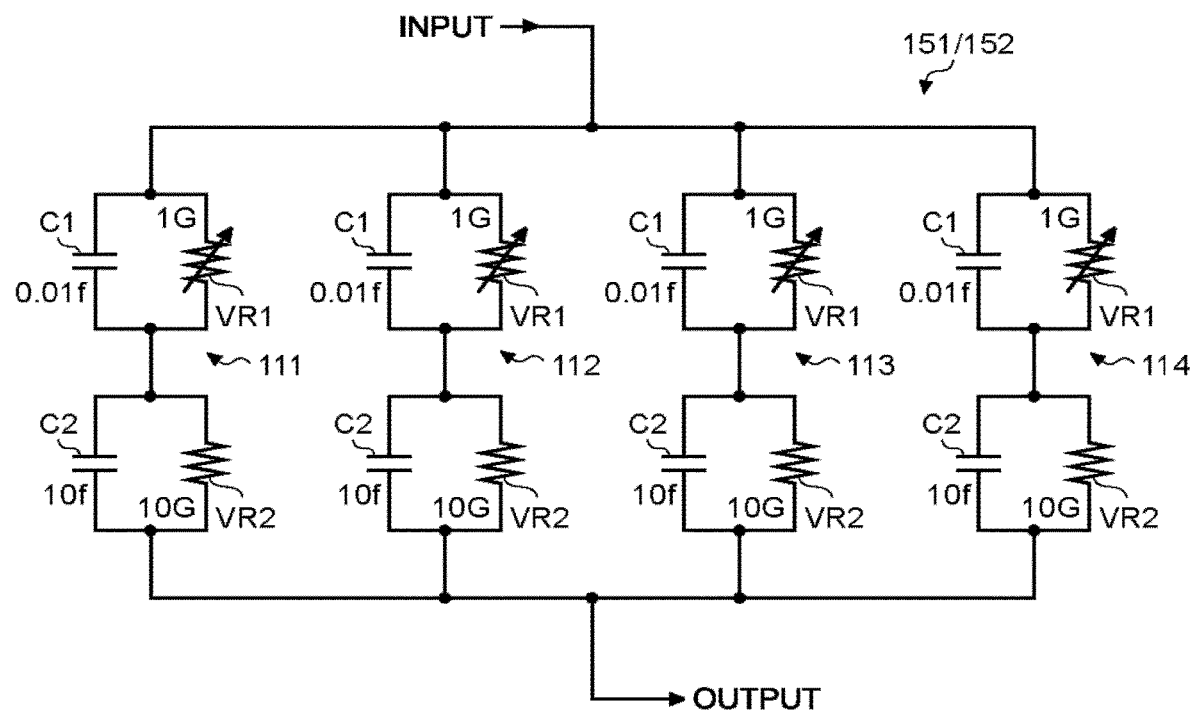
FIG. 9 is an equivalent circuit diagram illustrating a schematic configuration example of a memcapacitor in a neuro device used for a simulation in the first embodiment.
Figure 10:
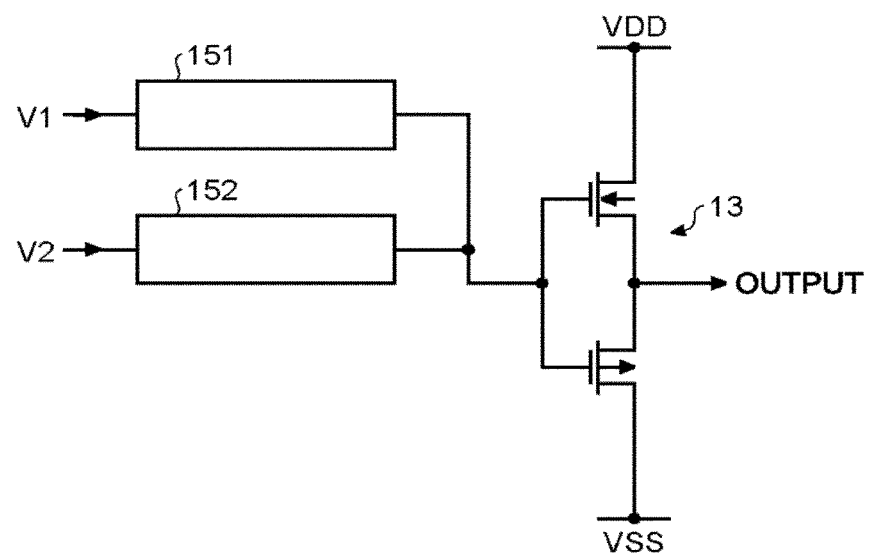
FIG. 10 is an equivalent circuit diagram illustrating a schematic configuration example of the neuro device used for the simulation in the first embodiment.

Next, a simulation result of the neuro device 10 according to the first embodiment is described. In the following descriptions, there is exemplified a simulation result of a neuro device 10 that includes four synapse devices 111 to 114 (hereinafter, "synapse device group") connected between an input and an output in parallel, as the variable capacitor 151/152 (see FIG. 7). FIG. 9 is an equivalent circuit diagram illustrating a schematic configuration example of respective variable capacitors, that is, a synapse device group in a neuro device used for a simulation in this explanation. FIG. 10 is an equivalent circuit diagram illustrating a schematic configuration example of a neuro device used for the simulation in this explanation.

Figure 11:
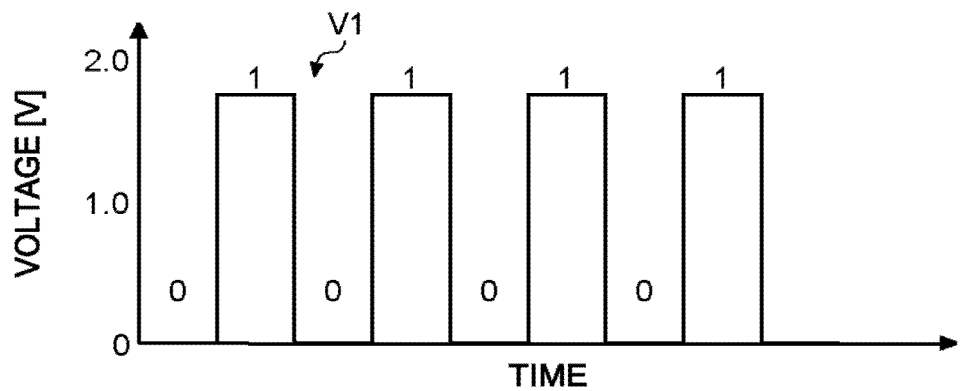
FIG. 11 is a voltage waveform diagram of a voltage V1 used in the simulation in the first embodiment.
Figure 12:
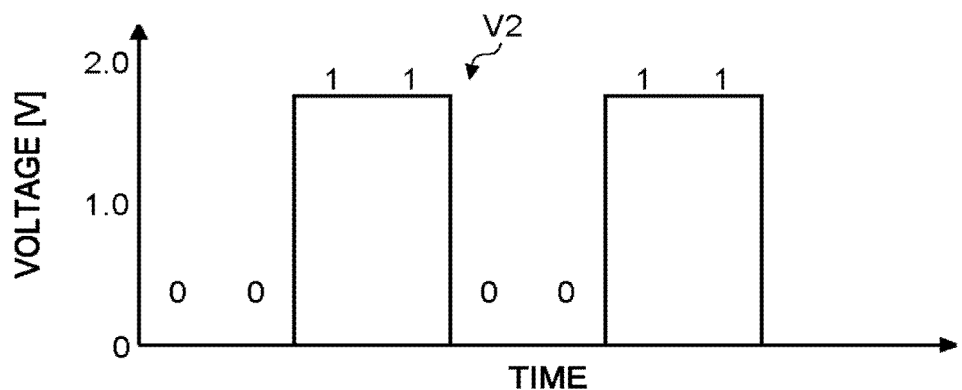
FIG. 12 is a voltage waveform diagram of a voltage V2 used in the simulation in the first embodiment.

As illustrated in FIG. 9, as the variable capacitor 151/152 used for the simulation, for example, there is assumed a circuit configuration in which four synapse devices 111 to 114 are connected in parallel with respect to an input. Further, as illustrated in FIG. 10, as the neuro device 10 used for the simulation, for example, there is assumed a circuit configuration including two variable capacitors 151 and 152 that have mutually different inputs and are connected in parallel to the threshold function unit 13 as an output. A voltage V1 and a voltage V2 are assumed as inputs to the variable capacitors 151 and 152, respectively. The waveform of the voltage V1 is illustrated in FIG. 11, and the waveform of the voltage V2 is illustrated in FIG. 12. As is apparent from a comparison between FIGS. 11 and 12, the frequency of the voltage V1 is set to be twice the frequency of the voltage V2.

Figure 14:
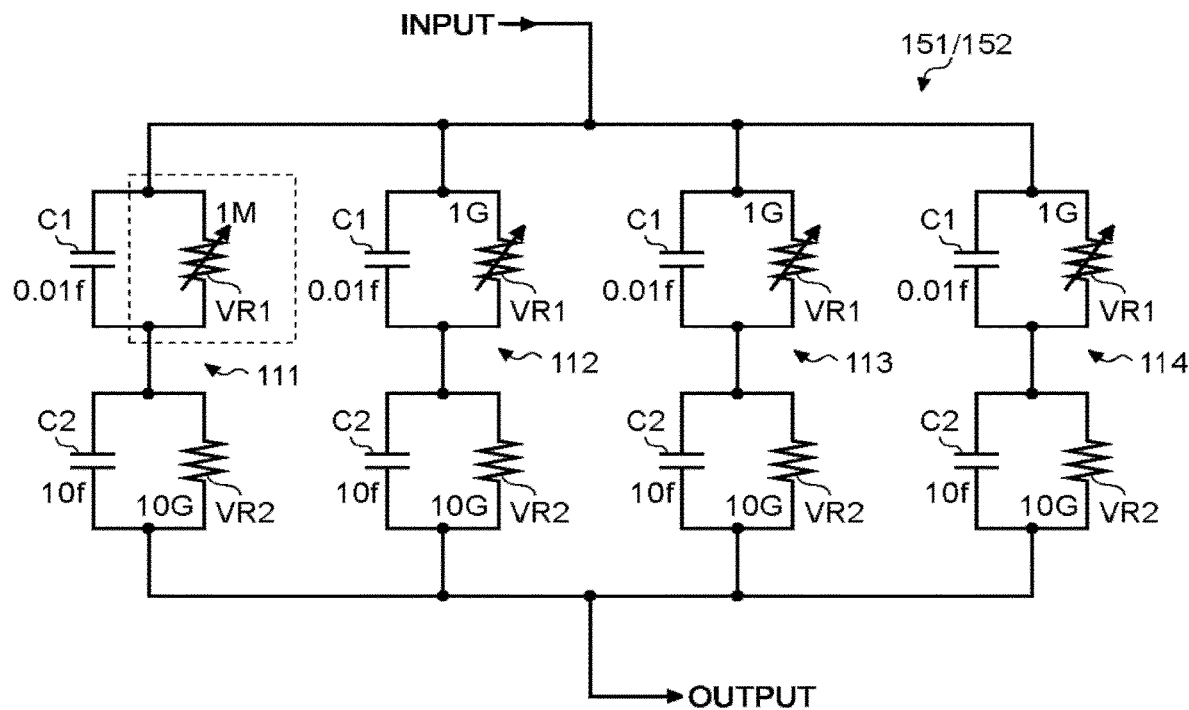
FIG. 14 is an explanatory diagram of a state of a memcapacitor after performing an arithmetic operation in the first embodiment, and is a diagram illustrating a state after a first arithmetic operation is performed.
Figure 16:
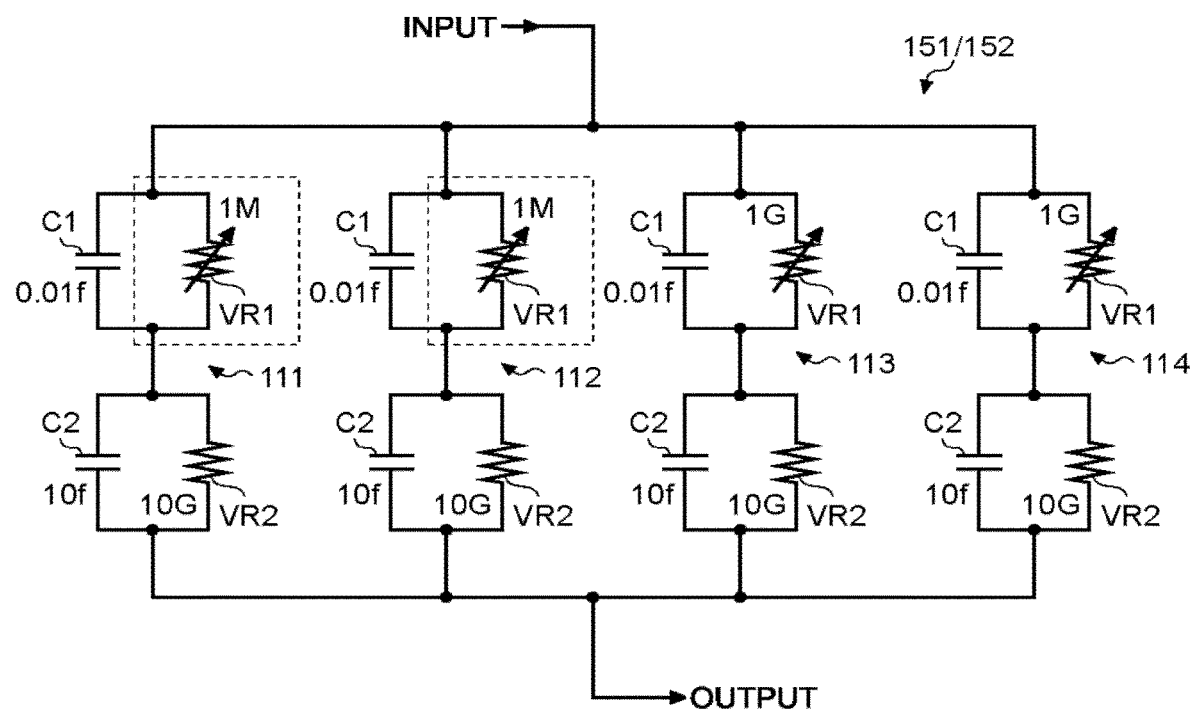
FIG. 16 is an explanatory diagram of a state of a memcapacitor after performing an arithmetic operation in the first embodiment, and is a diagram illustrating a state after a second arithmetic operation is performed.
Figure 18:
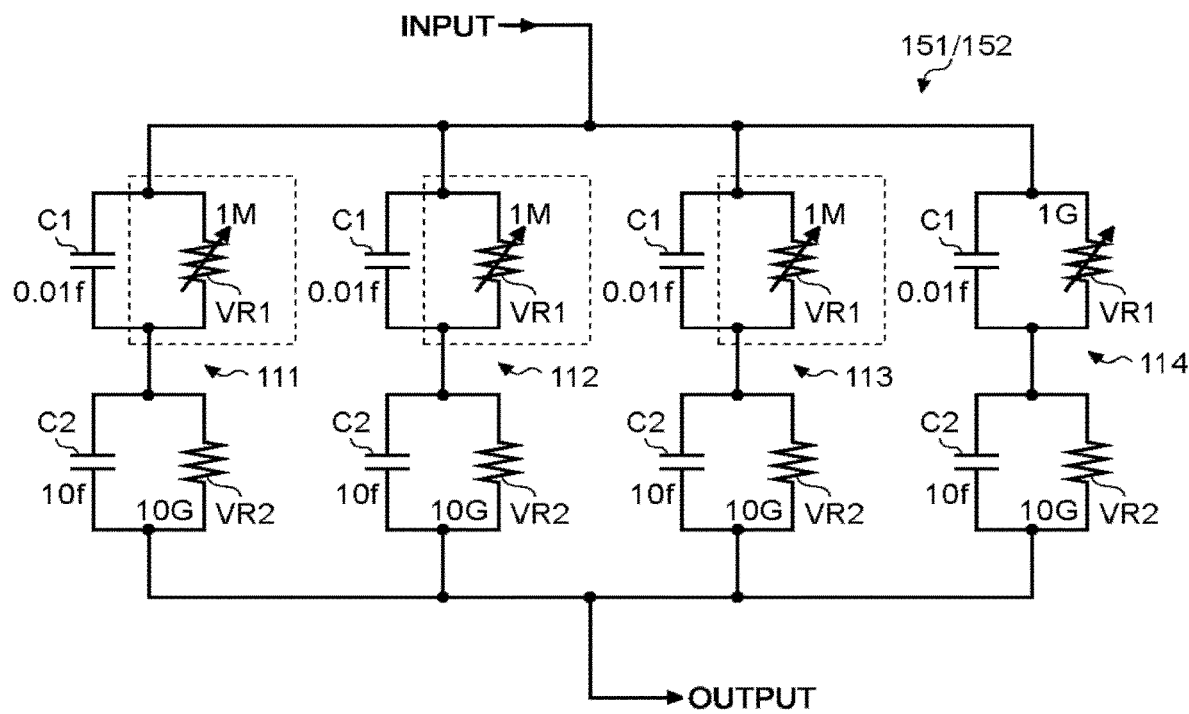
FIG. 18 is an explanatory diagram of a state of a memcapacitor after performing an arithmetic operation in the first embodiment, and is a diagram illustrating a state after a third arithmetic operation is performed.
Figure 20:
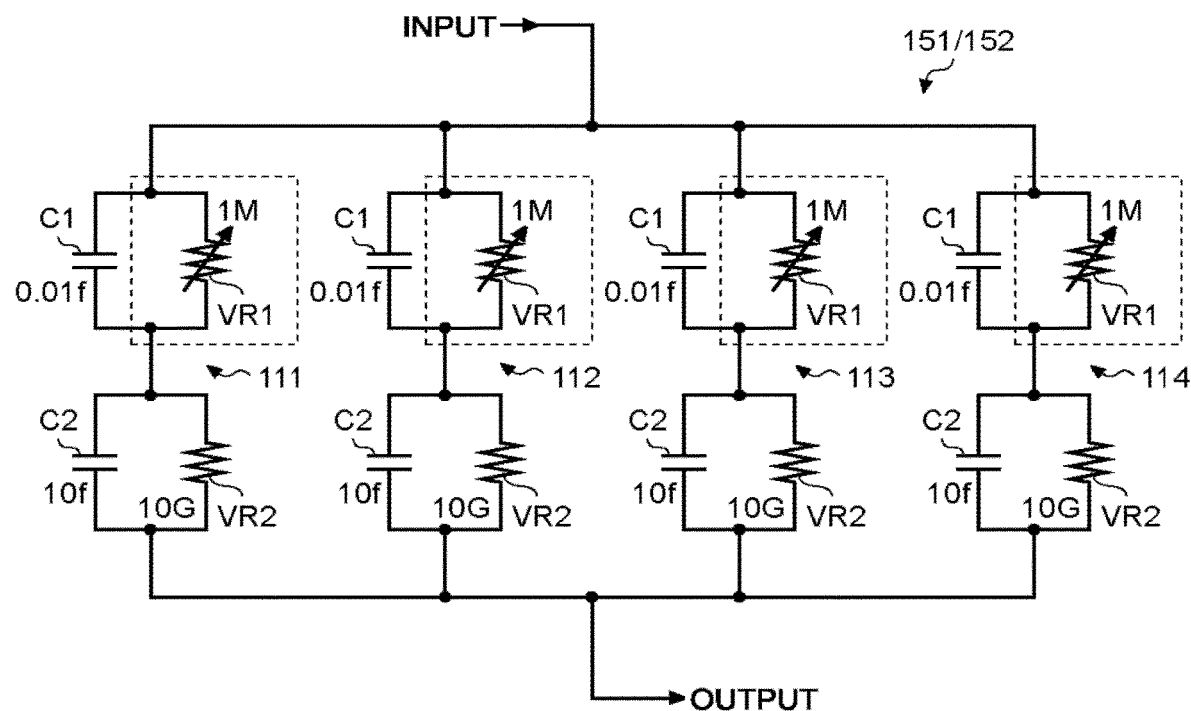
FIG. 20 is an explanatory diagram of a state of a memcapacitor after performing an arithmetic operation in the first embodiment, and is a diagram illustrating a state after a fourth arithmetic operation is performed.

FIGS. 14, 16, 18, and 20 are explanatory diagrams of states of the variable capacitor 151/152, that is, the synapse device group (the synapse devices 111 to 114) after an arithmetic operation is sequentially performed. FIG. 9 is used for explanations of an initial state. FIG. 14 illustrates a state of the synapse device group after a first arithmetic operation is performed, FIG. 16 illustrates a state of the synapse device group after a second arithmetic operation is performed, FIG. 18 illustrates a state of the synapse device group after a third arithmetic operation is performed, and FIG. 20 illustrates a state of the synapse device group after a fourth arithmetic operation is performed. In FIGS. 9, 14, 16, 18, and 20, a synapse device including a variable resistance device VR1 surrounded by a broken line represents a status that the synapse device is in a low-resistance state (for example, at about 1 mega-ohm). On the other hand, in FIGS. 9, 14, 16, 18, and 20, a synapse device including a variable resistance device VR1 not surrounded by a broken line represents a status that the synapse device is in a high-resistance state (for example, at about 1 giga-ohm).

Figure 13:
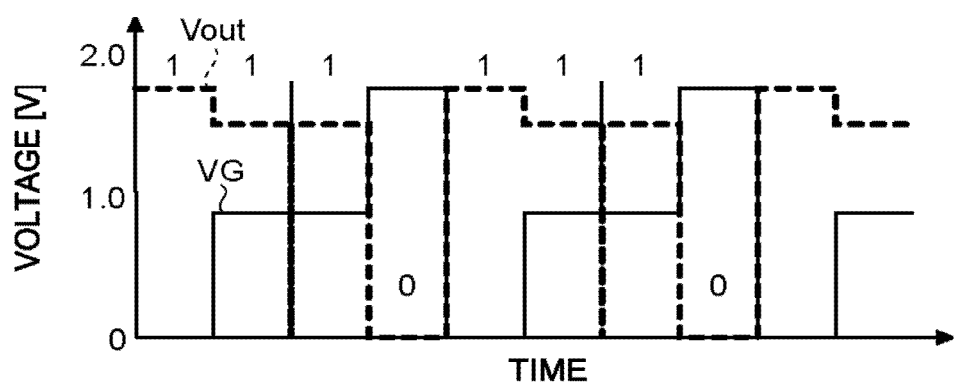
FIG. 13 is a diagram illustrating an example of a waveform of a voltage output from a threshold function unit of the neuro device in the state illustrated in FIG. 9.
Figure 15:
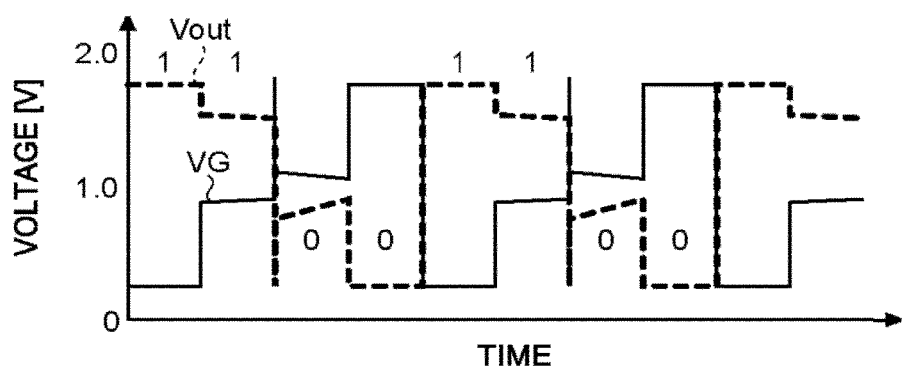
FIG. 15 is a diagram illustrating an example of a waveform of a voltage output from an inverter circuit of a neuro device in the state illustrated in FIG. 14.
Figure 17:
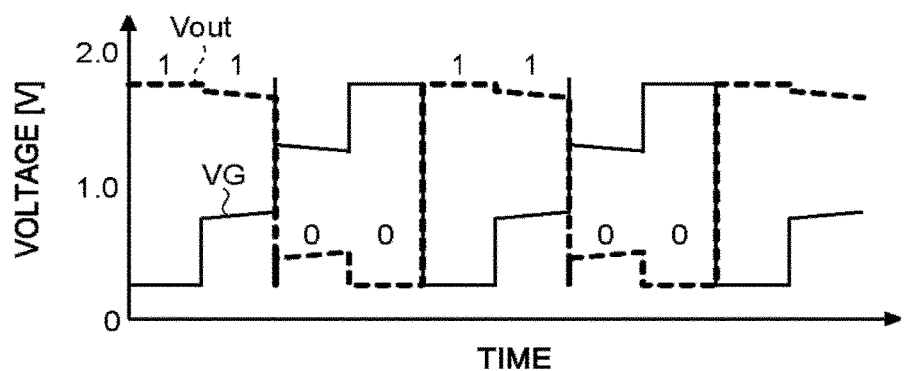
FIG. 17 is a diagram illustrating an example of a waveform of a voltage output from an inverter circuit of a neuro device in the state illustrated in FIG. 16.
Figure 19:
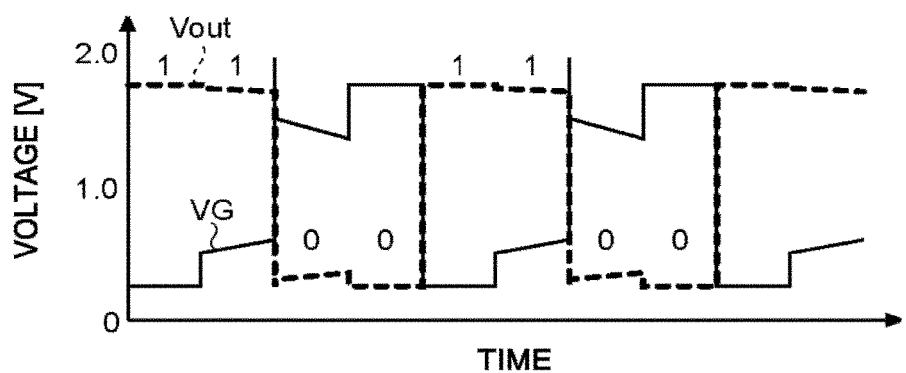
FIG. 19 is a diagram illustrating an example of a waveform of a voltage output from an inverter circuit of a neuro device in the state illustrated in FIG. 18.
Figure 21:
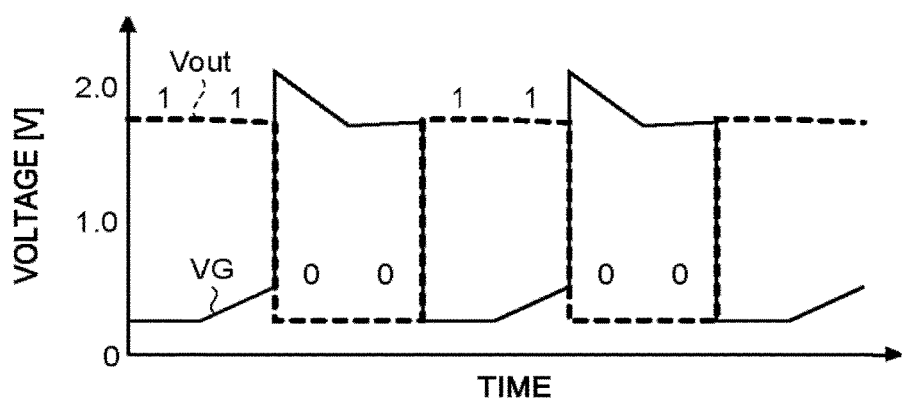
FIG. 21 is a diagram illustrating an example of a waveform of a voltage output from an inverter circuit of a neuro device in the state illustrated in FIG. 20.

FIGS. 13, 15, 17, 19, and 21 illustrate examples of waveforms of voltages output from the threshold function unit 13 of the neuro device 10 in the states illustrated in FIGS. 9, 14, 16, 18, and 20, respectively. FIG. 13 illustrates a waveform of a voltage output from the threshold function unit 13 in the initial state illustrated in FIG. 9, FIG. 15 illustrates a waveform of a voltage output from the threshold function unit 13 in the state illustrated in FIG. 14, FIG. 17 illustrates a waveform of a voltage output from the threshold function unit 13 in the state illustrated in FIG. 16, FIG. 19 illustrates a waveform of a voltage output from the threshold function unit 13 in the state illustrated in FIG. 18, and FIG. 21 illustrates a waveform of a voltage output from the threshold function unit 13 in the state illustrated in FIG. 20.

First, as illustrated in FIG. 13, when the voltage V1 ("01010101 . . . ") and the voltage V2 ("00110011 . . . ") are input to the neuro device 10 in which the four synapse devices 111 to 114 are in the initial state (see FIG. 9), an output Vout of "11101110 . . . " is output from the threshold function unit 13 of the neuro device 10 as an arithmetic operation result. Further, as illustrated in FIG. 14, the synapse device 111 is brought into a low-resistance state as the input history of the voltages V1 and V2.

Subsequently, as illustrated in FIG. 15, when the voltage V1 ("01010101 . . . ") and the voltage V2 ("00110011 . . . ") are input to the neuro device 10 in which the four synapse devices 111 to 114 are in the state illustrated in FIG. 14, the output Vout of "11001100 . . . " is output from the threshold function unit 13 of the neuro device 10 as the arithmetic operation result. That is, the input history of the voltages V1 and V2 for the first time is held in the variable capacitor 151/152 as a change in an electrostatic capacitance, so that the output Vout output from the neuro device 10 as the arithmetic operation result is changed from "11101110 . . . " to "11001100 . . . ". Further, as illustrated in FIG. 16, another synapse device (this is assumed as the synapse device 112) is brought into a low-resistance state as the input history of the voltages V1 and V2.

Thereafter, as illustrated in FIGS. 18 and 20, the synapse devices 113 and 114 are brought into a low-resistance state one by one by inputs of the voltages V1 and V2. However, the value of the output Vout output from the neuro device 10 as the arithmetic operation result does not change in a change of state from FIG. 16 to FIG. 18 and in a change of state from FIG. 18 to FIG. 20.

Next, a manufacturing method of the memcapacitor 11 in the neuro device 10 according to the first embodiment is described in detail with reference to the drawings. FIGS. 22 to 25 are schematic cross-sectional views illustrating manufacturing steps of the memcapacitor according to the first embodiment.

Figure 22:
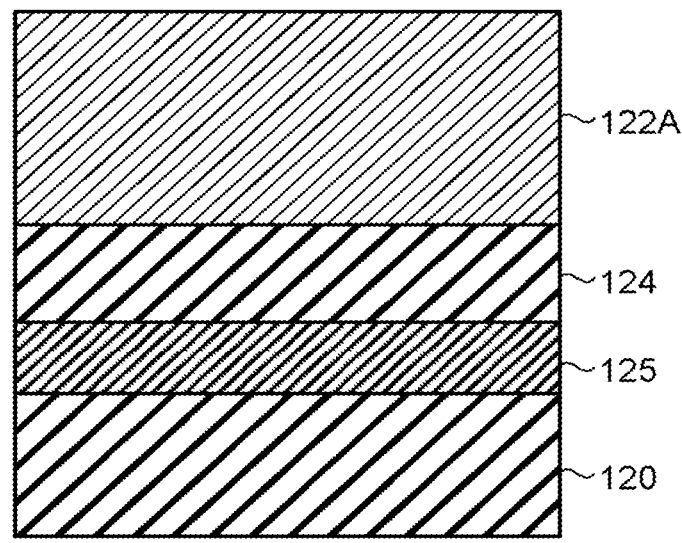
FIG. 22 is a schematic cross-sectional view illustrating manufacturing steps of the memcapacitor according to the first embodiment (part 1)

First, in this manufacturing method, as illustrated in FIG. 22, the lower electrode 125, the first dielectric layer 124, and a dielectric layer 122A to be processed into the variable resistance portion 122 are sequentially stacked on a semiconductor substrate 120, such as a silicon substrate. For the formation of the lower electrode 125, the first dielectric layer 124, and the dielectric layer 122A, it is possible to use various film formation techniques, for example, sputtering or epitaxial growth. Further, in the formation of the first dielectric layer 124, it is possible to use a process of forming a TiN film having a thickness of 10 nm (nanometers) as an underlying layer by sputtering or the like, sequentially forming a layer of dielectric body films of Al, Si, Ti, W and Ta each having a thickness of 5 nm on the underlying layer, and then stacking a layer of another material thereon.

Figure 23:
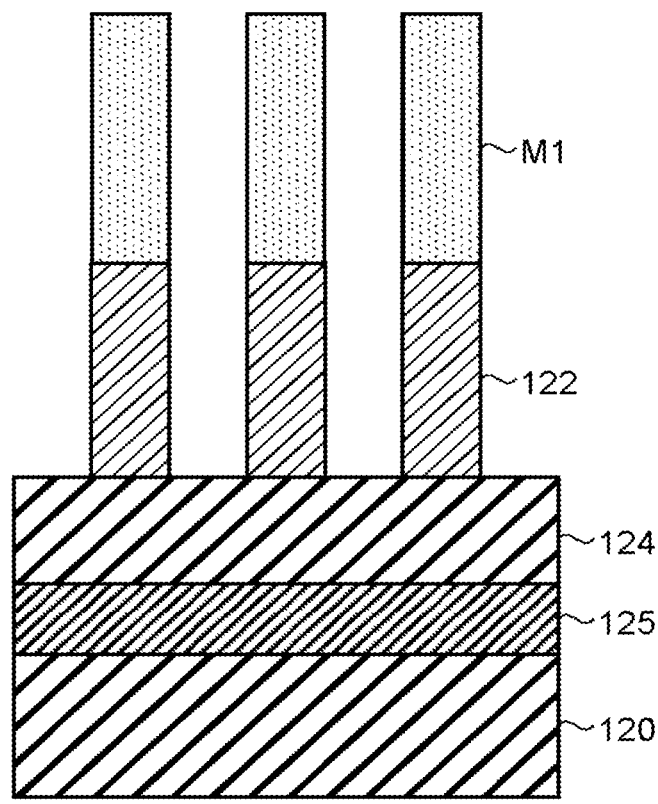
FIG. 23 is a schematic cross-sectional view illustrating manufacturing steps of the memcapacitor according to the first embodiment (part 2)

Subsequently, as illustrated in FIG. 23, a mask film M1 having the same pattern as that of the variable resistance portions 122 is formed on the dielectric layer 122A, and the dielectric layer 122A is patterned with this mask film M1 used as a mask. In this manner, the dielectric layer 122A is processed into the variable resistance portions 122. In patterning of the dielectric layer 122A into the variable resistance portions 122, it is possible to use an etching technique, such as Deep RIE (reactive ion etching). In addition, as the mask film M1, various types of films such as a resist film or a silicon oxide film can be used as long as the film ensures more than a certain etching selection ratio with respect to the dielectric layer 122A.

Figure 24:
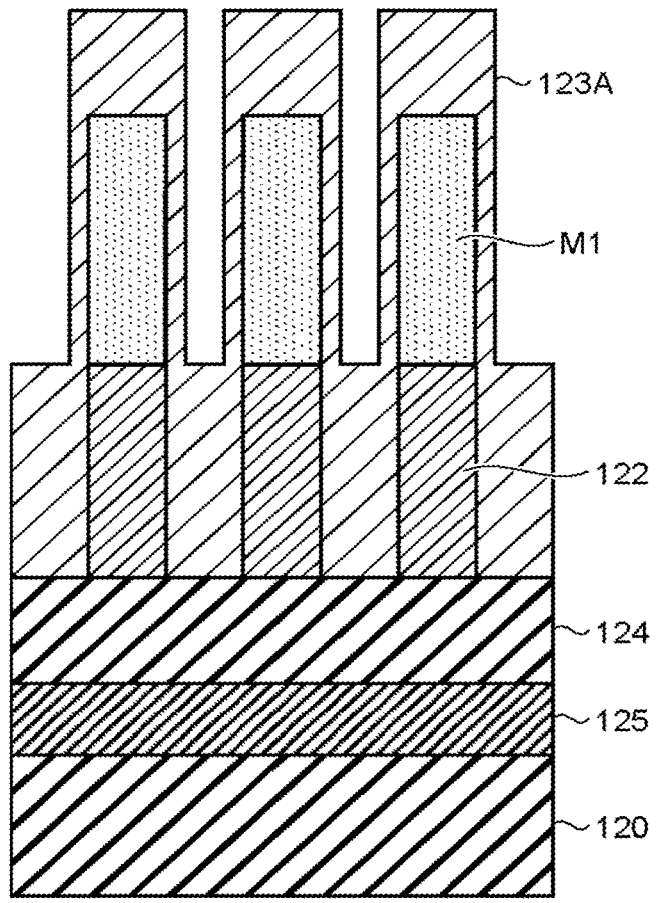
FIG. 24 is a schematic cross-sectional view illustrating manufacturing steps of the memcapacitor according to the first embodiment (part 3)

Thereafter, as illustrated in FIG. 24, a dielectric layer 123A to be processed into the second dielectric layer 123 is formed on the first dielectric layer 124 with the variable resistance portions 122 provided on its upper surface, in such a manner that spaces between the variable resistance portions 122 are buried with the dielectric layer 123A. In the formation of the dielectric layer 123A, sputtering can be used, for example.

Figure 25:
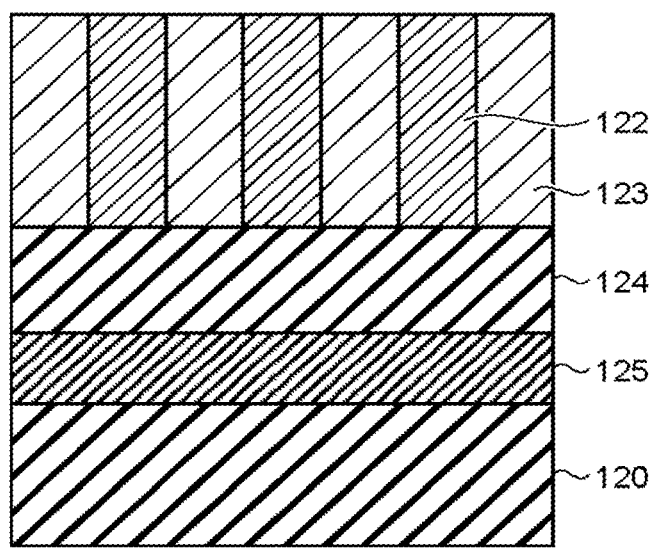
FIG. 25 is a schematic cross-sectional view illustrating manufacturing steps of the memcapacitor according to the first embodiment (part 4)

Subsequently, as illustrated in FIG. 25, a redundant portion of the dielectric layer 123A upper than upper surfaces of the variable resistance portions 122 is removed. In this removal process, it is possible to use a so-called "lift-off method", in which the redundant portion of the dielectric layer 123A is removed by removing the mask layer M1. However, the method for this removal is not limited thereto, and the redundant portion of the dielectric layer 123A can be removed by CMP (Chemical Mechanical Polishing), for example. Further, after the redundant portion of the dielectric layer 123A is removed by the lift-off method, the upper surfaces of the variable resistance portions 122 and the second dielectric layer 123 can be flattened by CMP or the like.

Thereafter, for example, the upper electrode 21 formed of a titanium (Ti) film having a thickness of 20 nm as an underlying layer and a gold (Au) film having a thickness of 50 nm on the titanium film is formed on the upper surface of the variable resistance portions 122 and the second dielectric layer 123, and then the memcapacitor 11 is subjected to element separation. In this manner, the memcapacitor 11 having the cross-sectional structure illustrated in FIG. 5 can be manufactured. For the formation of the upper electrode 121, sputtering, epitaxial growth, and the like can be used. Further, for the element separation of the memcapacitor 11, an etching technique such as Deep RIE can be used.

As described above, according to the first embodiment, it is possible to realize the memcapacitor 11 that functions as the synapse devices 111 to 11N. As a result, the arithmetic operation speed of each of the neuro devices 10 can be improved, and thus this enables the neural network device 1 with an improved processing performance to be realized.

Further, according to the first embodiment, the memcapacitor 11 is realized by applying a technology of a non-volatile multi-value memory, specifically, a technology of a resistance random access memory in which the filament 126 is formed within the variable resistance portion 122. Therefore, it is possible to simultaneously realize both application of a plurality of weights and improvement of the arithmetic operation speed.

Furthermore, according to the first embodiment, the synapse devices 111 to 11N that are arithmetic operation gates of the neural network device 1 are created by the memcapacitors 11 that are multi-value capacitors. Therefore, it is possible to realize the neuro device 10 provided with the synapse devices 111 to 11N in each of which an electrostatic capacitance is changed to multiple values with an input history of an electric signal, as well as the neural network device 1 including the neuro device 10.

Second Embodiment

Next, a memcapacitor, a neuro device, and a neural network device according to a second embodiment are described in detail with reference to the drawings. In the second embodiment, another example of the upper electrode 121 according to the first embodiment is described.

Figure 26:
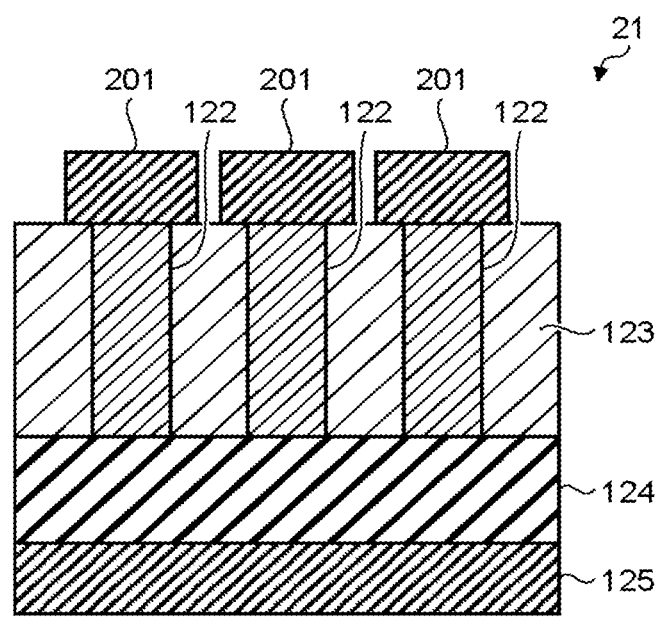
FIG. 26 is a schematic cross-sectional view illustrating a schematic configuration example of a memcapacitor according to a second embodiment.
Figure 27:
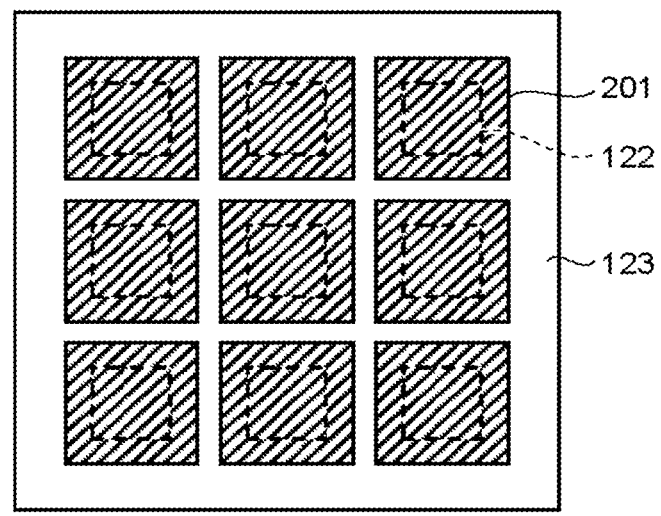
FIG. 27 is a top view illustrating a layout example of upper electrodes as the memcapacitor illustrated in FIG. 26 is viewed from above.

In the first embodiment described above, a common upper electrode 121 is provided to the entirety of the plurality of variable resistance portions 122 in one memcapacitor 11; however, the present invention is not limited to this configuration. FIG. 26 is a cross-sectional view illustrating a schematic configuration example of a memcapacitor according to the second embodiment. FIG. 27 is a top view illustrating a layout example of upper electrodes as the memcapacitor illustrated in FIG. 26 is viewed from above.

As illustrated in FIGS. 26 and 27, in the second embodiment, a memcapacitor 21 has a configuration in which upper electrodes 201 are individually provided for respective variable resistance portions 122. Due to this configuration, it is possible to realize the synapse devices 111 to 11N capable of performing an arithmetic operation with respect to a plurality of inputs. It is also possible to individually program the electrostatic capacitance of each of the second capacitors 15 in the memcapacitor 21. Therefore, the memcapacitor 21 can be programmed more flexibly and more precisely. As a result, it is possible to further increase the number of values that the synapse devices 111 to 11N as an arithmetic operation gate of a neural network take, so that the neuro device 10 capable of performing more sophisticated arithmetic processing at a high speed can be realized.

Other configurations, operations, and effects of the second embodiment are identical to those of the first embodiment, and thus redundant descriptions thereof will be omitted.

Third Embodiment

Figure 28:
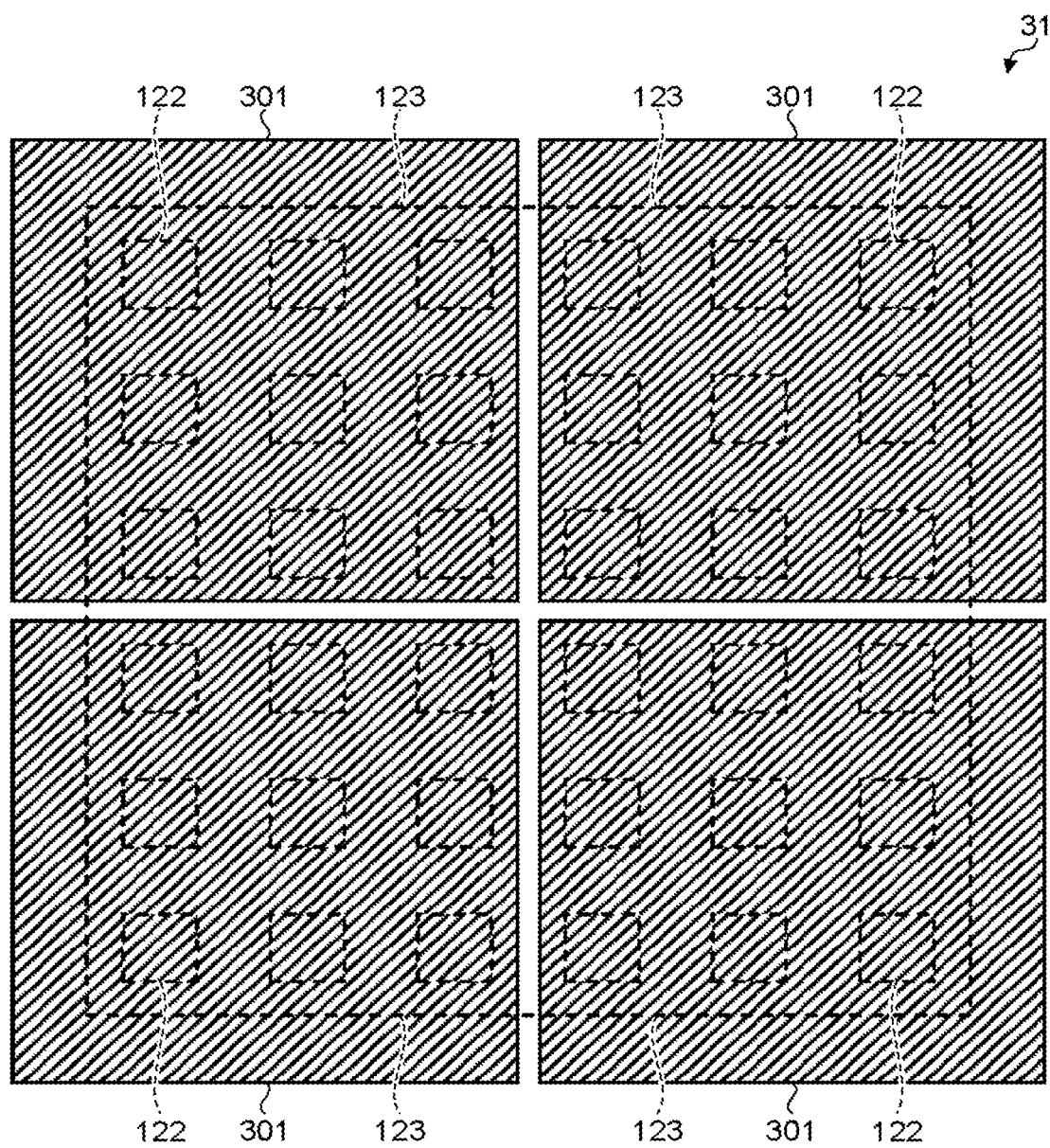
FIG. 28 is a top view illustrating a layout example of upper electrodes as a memcapacitor according to a third embodiment is viewed from above.

In a third embodiment, still another example of the upper electrode 121 according to the first embodiment is described. FIG. 28 is a top view illustrating a layout example of upper electrodes as a memcapacitor according to the third embodiment is viewed from above.

As illustrated in FIG. 28, a memcapacitor 31 according to the third embodiment has a configuration in which the plurality of variable resistance portions 122 are divided into two or more groups, and upper electrodes 301a to 301d are individually provided for the respective groups. In the example illustrated in FIG. 28, thirty-six variable resistance portions 122 are divided into four groups each including nine variable resistance portions 122, and the upper electrode 301 is provided for each group.

Due to the above configuration, it is possible to realize a neuro device capable of performing an arithmetic operation with respect to a plurality of inputs while including the synapse devices 111 to 11N, which is an arithmetic operation gate of a neural network, formed of the memcapacitors 31 that takes multiple values. Further, it is also possible to individually program the electrostatic capacitance of the second capacitor 15 in the memcapacitor 31 on a group-by-group basis, and therefore the memcapacitor 31 can be programmed more flexibly and more precisely.

Other configurations, operations, and effects of the third embodiment are identical to those of the above embodiments, and thus redundant descriptions thereof will be omitted.

Fourth Embodiment

In a fourth embodiment, another layout example of the variable resistance portions 122 arranged on the first dielectric layer 124 (see FIG. 5) according to the first embodiment is described by way of example.

Figure 29:
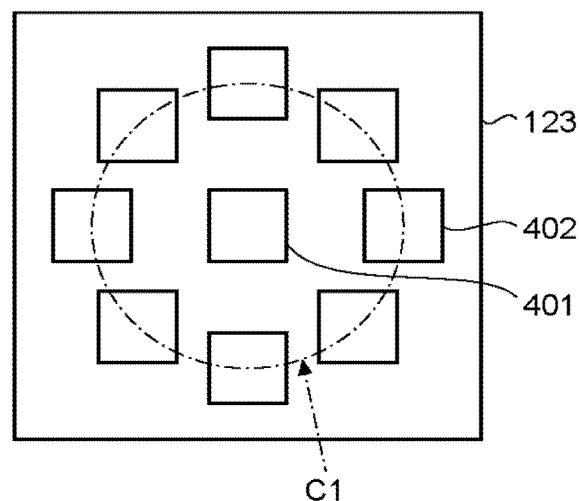
FIG. 29 is a layout diagram illustrating a first layout example of variable resistance portions according to a fourth embodiment.

FIG. 29 is a layout diagram illustrating a first layout example of variable resistance portions according to the fourth embodiment. In the first layout example illustrated in FIG. 29, variable resistance portions 401 and 402 are laid out in such a manner that centers of the plurality of variable resistance portions 402 are equidistantly arranged from each other on a circumference C1 of a circle centered on a central variable resistance portion 401. This layout can reduce the bias of effects of the filaments 126 each formed inside the variable resistance portions 401 and 402, and therefore enables creation of a memcapacitor with better characteristics.

Figure 30:
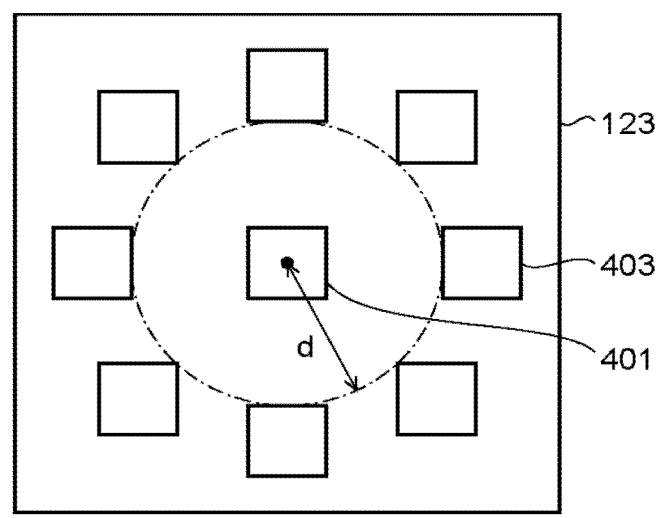
FIG. 30 is a layout diagram illustrating a second layout example of the variable resistance portions according to the fourth embodiment.

FIG. 30 is a layout diagram illustrating a second layout example of the variable resistance portions according to the fourth embodiment. In the second layout example illustrated in FIG. 30, a plurality of variable resistance portions 403 are equidistantly arranged from each other to keep a predetermined distance d from the center of the variable resistance portion 401 arranged at a central part. This layout can reduce the bias of effects of the filaments 126 each formed inside the variable resistance portions 401 and 403 as in the first layout example, and therefore enables creation of a memcapacitor with better characteristics.

Other configurations, operations, and effects of the fourth embodiment are identical to those of the above embodiments, and thus redundant descriptions thereof will be omitted.

Fifth Embodiment

Figure 31:
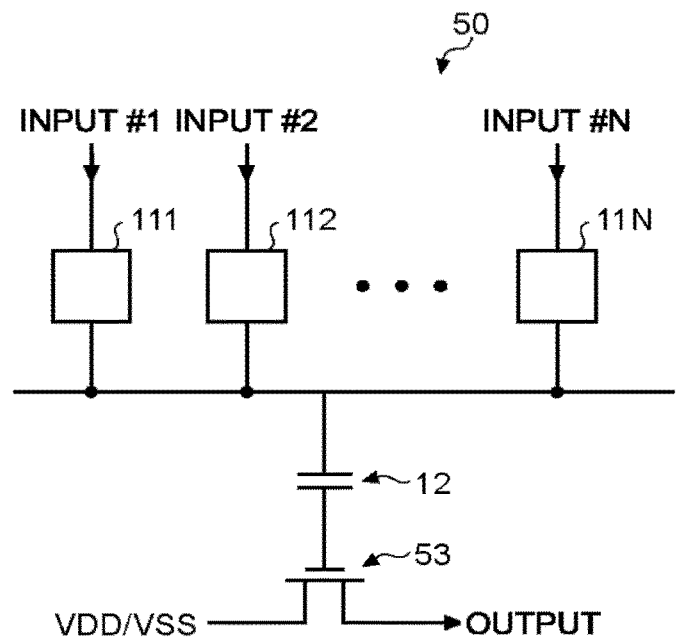
FIG. 31 is a diagram illustrating a schematic configuration example of a neuro device according to a fifth embodiment.

In a fifth embodiment, another example of the neuro device 10 according to the first embodiment illustrated in FIG. 3 is described with reference to the drawings. FIG. 31 is a diagram illustrating a schematic configuration example of a neuro device according to the fifth embodiment. As illustrated in FIG. 31, a neuro device 50 according to the fifth embodiment has a similar configuration to that of the neuro device 10 illustrated in FIG. 3, in which the threshold function unit 13 is formed of a MOSFET (metal-oxide-semiconductor field-effect transistor) 53. Also due to this configuration, it is possible to process an electric signal that is generated in image processing or the like and is an object of processing, by the processing unit 2 including the neuro device 50, as in the first embodiment.

Other configurations, operations, and effects of the fifth embodiment are identical to those of the above embodiments, and thus redundant descriptions thereof will be omitted.

Sixth Embodiment

Figure 32:
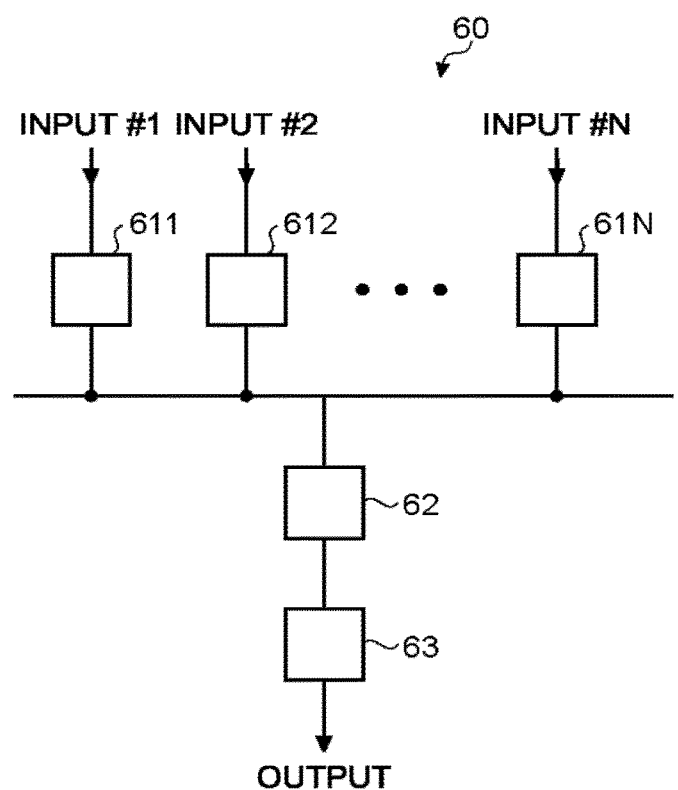
FIG. 32 is a diagram illustrating a schematic configuration example of a neuro device according to a sixth embodiment.

In a sixth embodiment, still another example of the neuro device 10 according to the first embodiment illustrated in FIG. 3 is described with reference to the drawings. FIG. 32 is a diagram illustrating a schematic configuration example of a neuro device according to the sixth embodiment. As illustrated in FIG. 32, a neuro device 60 according to the sixth embodiment has a similar configuration to that of the neuro device 10 illustrated in FIG. 3, in which all of the synapse devices 111 to 11N, the integrator 12, and the threshold function unit 13 are constituted by memcapacitors 611 to 61N, 62, and 63. Each of the memcapacitors 611 to 61N, 62, and 63 can be identical to the memcapacitor 11 and the like according to the embodiments described above.

As described above, in the processing unit 2 (see FIG. 1) in the neural network device 1, it is possible to constitute all of the synapse devices, the integrator, and the threshold function unit by the memcapacitors. In other words, the memcapacitor 11 and the like including the variable capacitor as its base according to the embodiments described above can be used as the integrator 12, and can be also used as the threshold function unit 13.

Also due to this configuration, similarly to the first embodiment, an electric signal generated in image processing and the like, which is a processing target, can be processed by the processing unit 2 including the neuro device 50.

Other configurations, operations, and effects of the sixth embodiment are identical to those of the above embodiments, and thus redundant descriptions thereof will be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memcapacitor comprising:
a first electrode provided on a semiconductor substrate;
a first dielectric layer provided on the first electrode;
a plurality of variable resistance portions provided separately from each other on the first dielectric layer;
a second dielectric layer provided on the first dielectric layer and between the variable resistance portions; and
a second electrode provided on the variable resistance portions and the second dielectric layer, wherein
each of the variable resistance portions is formed of a material that allows diffusion of metal atoms constituting the second electrode to inside of the each of the variable resistance portions.

2. The memcapacitor according to claim 1, wherein the second dielectric layer is formed of a material that prevents diffusion of metal atoms constituting the second electrode to inside of the second dielectric layer.

3. The memcapacitor according to claim 1, wherein the second electrode is divided to be provided on each of the variable resistance portions.

4. The memcapacitor according to claim 1, wherein
the variable resistance portions are divided into two or more groups each including at least one of the variable resistance portions, and
the second electrode is divided to be provided for each of the two or more groups.

5. The memcapacitor according to claim 1, wherein
the variable resistance portions include
a first variable resistance portion, and
a plurality of second variable resistance portions that are equidistantly arranged from each other on a circumference of a circle centered on the first variable resistance portion.

6. The memcapacitor according to claim 1, wherein
the variable resistance portions include
a first variable resistance portion, and
a plurality of second variable resistance portions that are equidistantly arranged from each other to keep a predetermined distance from a center of the first variable resistance portion.

7. A neuro device comprising:
the memcapacitor according to claim 1; and
a threshold function unit that is connected to the memcapacitor.

8. The neuro device according to claim 7, wherein in the memcapacitor,
each of the variable resistance portions is a portion of a synapse device that holds a weights with respect to an input signal, and
the first dielectric layer is a portion of an integrator that performs a product-sum operation for an input signal modulated with a weights held in each of the variable resistance portions.

9. The neuro device according to claim 7, wherein the threshold function unit has a same structure as the memcapacitor.

10. A neural network device comprising:
a plurality of word lines;
a plurality of bit lines that cross the word lines to be vertically separated from the word lines; and
the memcapacitor according to claim 1 that is connected to each of portions where the word lines and the bit lines come close to each other.

* * * * *